331-98

SEARCH ROOM

April 26, 1960 I. M. BRUNTIL ET AL 2,934,717

ULTRA HIGH FREQUENCY OSCILLATOR

Filed May 29, 1958

INVENTORS
Irwin M. Bruntil
Jonas M. Shapiro
BY Daniel Jay Tick
Alfred E. Miller
Attorneys 2,934,717

ULTRA HIGH FREQUENCY OSCILLATOR

Irwin M. Bruntil and Jonas M. Shapiro, Stamford, Conn., assignors to Manson Laboratories, Incorporated, a corporation of Connecticut Application May 29, 1958, Serial No. 738,792

5 Claims. (Cl. 331—98)

Figure 1:
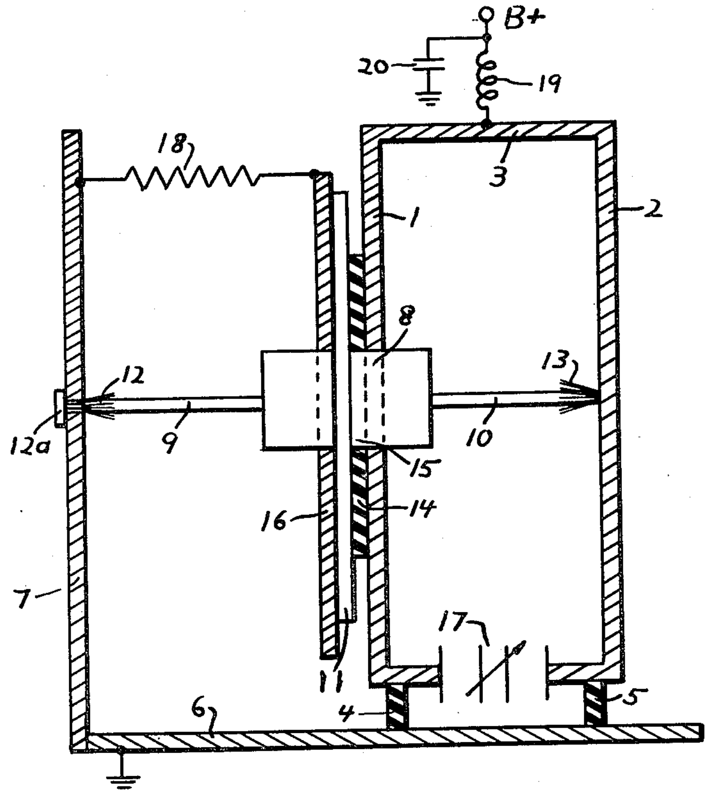

The present invention relates to an ultra high frequency oscillator arrangement. More particularly, the invention relates to an ultra high frequency oscillator arrangement utilizing a pencil type triode in a compact and relatively simple structure.

The oscillator arrangement of the present invention has a number of advantages due to its structure and operation. Among these advantages, aside from compact and relatively simple structure, are reduced noise and microphonics as well as improved and relatively high stability, ultra linear operation, relatively high tuned circuit quality, relatively high inductance to capacitance ratio, relatively low cost but high efficiency in operation, utilization of a tube normally used in a cavity or coaxial lines as the oscillator tube of the lumped circuit oscillator arrangement of the present invention, operation as a convenient tuning arrangement, operation to attain straight line frequency tuning, variation of the oscillator frequency without utilizing sliding contacts, facile adjustment of the tank inductance of the oscillator, facile removability of the oscillator tube from the arrangement and reduced radiation losses.

The principal object of the present invention is the provision of a new and improved ultra high frequency oscillator arrangement utilizing a pencil type triode.

An object of the present invention is the provision of an ultra high frequency oscillator arrangement having a compact and relatively simple structure.

Another object of the present invention is the provision of an ultra high frequency oscillator arrangement of reduced noise and microphonics as well as improved and relatively high stability.

Another object of the present invention is the provision of an ultra high frequency oscillator arrangement providing ultra linear operation.

Another object of the present invention is the provision of an ultra high frequency oscillator arrangement having a relatively high tuned circuit quality.

Another object of the present invention is the provision of an ultra high frequency oscillator arrangement utilizing a relatively high inductance to capacitance ratio.

Another object of the present invention is the provision of an ultra high frequency oscillator arrangement operating as a convenient tuning arrangement and to attain straight line frequency tuning.

Another object of the present invention is the provision of an ultra high frequency oscillator arrangement embodying means for facile adjustment of the tank inductance and for variation of the oscillator frequency without utilizing sliding contacts.

Another object of the present invention is the provision of an ultra high frequency oscillator arrangement utilizing a facilely removable oscillator tube.

Another object of the present invention is the provision of an ultra high frequency oscillator arrangement having reduced radiation losses.

Still another object of the present invention is the provision of an ultra high frequency oscillator arrangement of relatively low cost but high efficiency in operation.

Figure 2:
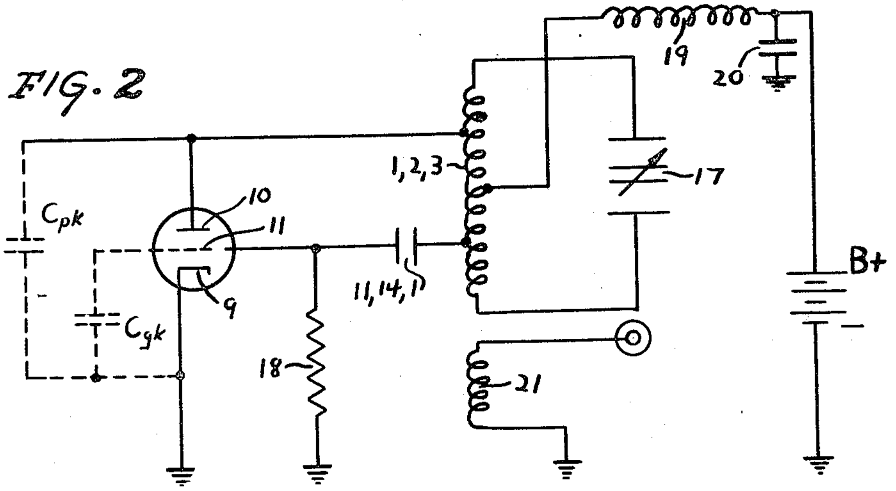

These and other objects and features of the invention will be apparent from a consideration of the following detailed description taken in connection with the accompanying drawing, wherein:

Fig. 1 is a schematic diagram, partly in section as well as partly electrical and partly mechanical, of an embodiment of the arrangement of the present invention; and Fig. 2 is a schematic diagram of the circuit arrangement of the embodiment of Fig. 1.

In Fig. 1, a tank inductance comprising a plate member having two substantially vertical sides 1 and 2, respectively, and a substantially horizontal top 3 is insulatedly supported, such as, for example, by blocks of insulating material 4 and 5. The blocks 4 and 5 may be supported by a base plate 6. A frame member 7 may be removably affixed to the base plate or it may be affixed to said base plate and have a removable section therein. The base plate 6, and therefore the frame member 7, are connected to a point at ground potential. The side 1 of the tank inductance has an aperture 8 therein in which is positioned a pencil type triode comprising a relatively elongated cathode member 9 at one extremity thereof and a relatively elongated anode member 10 at the other extremity thereof. The pencil type triode further comprises a disc type flange member 11 constituting a grid; the flange member 11 being interposed between the cathode 9 and the anode 10. The cathode 9 is seated in a cathode connector 12 affixed to the frame member 7 and the anode 10 is seated in an anode connector 13 affixed to the side 2 of the tank inductance. The triode is easily removable from the apparatus because the frame member 7, or the section thereof supporting the connector 12, is removable. The connectors 12 and 13 are in electrical contact with their respective supporting members 7 and 2. Since the supporting member 7 is connected to a point at ground potential, the cathode 9 is connected to said point at ground potential. The connectors 12 and 13 may comprise any suitable contact connectors and in the embodiment shown each comprise a plurality of fingers substantially circularly affixed at their bases to a supporting member and extending from the supporting member in a manner whereby they grip the corresponding electrode relatively firmly although the tube is readily removable due to their use. The cathode connector 12 preferably comprises an additional member 12a for supplying heating current to the filament leads of the tube.

The triode is positioned in the aperture 8 and the connectors 12 and 13 in a manner whereby the anode 10 is in electrical contact with the side 2 of the tank inductance and the flange member 11 is adjacent the side 1 of said tank inductance and substantially parallel thereto. A dielectric plate 14 having an aperture 15 therein is interposed between the side 1 of the tank inductance and the flange member 11 in a manner whereby the apertures 8 and 15 are substantially coaxial. The flange member 11 is urged toward the side 1 of the tank inductance by any suitable means known in the art, such as, for example, a clamping member 16. The side 1 of the tank inductance, the dielectric plate 14 and the flange member 11 thus form a grid capacitor which is quite compact since one of its plates 1 is a portion of the tank inductance and the other of its plates is said flange member of the triode. Since there are no capacitor leads, any inductive effects which may result from such leads is eliminated.

Since the triode is inserted directly into the tank circuit without a socket, the lead inductance and stray capacitance of the circuit is greatly reduced if not substantially eliminated. This great reduction of lead inductance and stray capacitance permits the use of a relatively high inductance to capacitance ratio with a consequent increase in power output.

The tank inductance may be facilely adjusted by moving a short-circuiting member (not shown in the figures) along an edge of said tank inductance thereby adapting the arrangement for tracking purposes. The closed structure and rigid support of the tank inductance aid in providing reduced harmonics and higher stability and the compact size of the arrangement adapts the entire arrangement for facile shielding thereby reducing radiation losses. Since the oscillator tube is across only a portion of the tank inductance a relatively high tuned circuit quality is attained.

A split stator type variable capacitor 17 is connected between the sides 1 and 2 of the tank inductance thereby being connected in parallel connection with said tank inductance. The use of the split stator capacitor 17, which has no sliding contacts, aids in providing reduced noise and improved stability. A grid bias resistor 18 is connected between the clamping member 16 and the frame member 7 so that said resistor is connected to a point at ground potential through said frame member and to the grid 11 through said clamping member. Of course, the cathode 9 and grid bias resistor 18 may be connected to a point at ground potential by any suitable means known in the art; the frame member 7 being shown for illustrative purposes only.

The split stator capacitor 17, the tank inductance 1, 2 and 3, and the frame member 7 are preferably made of "Invar" and are therefore relatively independent of temperature variations.

A bias voltage is applied to the tank inductance from a source of bias voltage B+ such as a battery or the like. The bias voltage is applied to the tank inductance from the source of bias voltage through a radio frequency choke coil 19 which is connected between said bias voltage source and a point on the top 3 of the tank inductance; said point of connection being substantially midway between the sides 1 and 2 thereof. A bypass capacitor 20 is connected between the bias voltage source end of the choke coil 19 and a point at ground potential. An output oscillation may be derived from the tank inductance by any suitable means known in the art, such as, for example, a secondary winding positioned in inductive relation with said tank inductance, as shown in Fig. 2.

The oscillator circuit arrangement of the present invention is tuned by variation of the split stator capacitor 17. The plate shape of the split stator capacitor 17 is designed to produce a linear increment in frequency for each rotation of the rotor so that a straight line frequency variation is produced.

The arrangement of the present invention is not only compact and of relatively simple structure, as is obvious, but functions as an ultra high frequency oscillator of relatively high stability, ultra linear operating characteristics, having a relatively high tuned circuit quality and a relatively high inductance to capacitance ratio, and is thus low in cost and high in efficiency.

Fig. 2 is a schematic diagram of the circuit arrangement of the embodiment of Fig. 1. Similar elements of Figs. 1 and 2 are indicated by the same reference numerals. The output oscillations may be derived from a secondary winding 21 positioned in inductive relation with the tank inductance 1, 2, 3.

The circuit arrangement of the present invention functions as an ultra audion oscillator, which is similar to a Colpitts type oscillator utilizing the interelectrode capacities of the singe tube as the feedback coupling. The description and operation of an ultra audion oscillator are set forth on pages 7–15 to 7–21 of "Principles of Radar," by the members of the staff of the Radar School of the Massachusetts Institute of Technology, second edition, published by the McGraw-Hill Book Company, Inc., of New York city, in 1946.

In order to aid in the understanding of the operation of the circuit arrangement of the present invention as an ultra audion oscillator, as described in the "Principles of Radar" textbook, the grid to cathode and plate to cathode interelectrode capacities *Cgk* and *Cpk*, respectively, are shown in Fig. 2.

Pencil triodes of the type utilized in the arrangement of the present invention are manufactured by the General Electric Company, the Radio Corporation of America and the Sylvania Electric Products Company as the 5675 tube and are described in Technical Data Sheet for Pencil Type Triode No. 5675 published at present by Sylvania Electric Products, Incorporated, Electronics Division, Woburn, Massachusetts.

While the invention has been described by means of a specific example and in a specific embodiment, we do not wish to be limited thereto, for obvious modifications will occur to those skilled in the art without departing from the spirit and scope of the invention.

What we claim is:

1. An ultra high frequency oscillator arrangement, comprising supporting means, a tank inductance comprising a plate member having two substantially vertical sides supported by said supporting means and a substantially horizontal top joining said sides, one of said sides having an aperture therein, a pencil type triode comprising a relatively elongated cathode member at one extremity thereof and a relatively elongated anode member at the other extremity thereof and a disc type flange member constituting a grid interposed between said cathode and said anode, said triode being positioned in said aperture in a manner whereby said anode is in electrical contact with the other of the sides of said tank inductance and said flange member is adjacent said one side of said tank inductance and substantially parallel thereto, a dielectric plate having an aperture therein, said dielectric plate being interposed between said one side of said tank inductance and said flange member in a manner whereby said first-mentioned and said last-mentioned apertures are substantially coaxial, and means maintaining said dielectric plate interposed between said flange member and said one side of said tank inductance thereby to provide a grid capacitor.

2. An ultra high frequency oscillator arrangement, comprising supporting means, a tank inductance comprising a plate member having two substantially vertical sides supported by said supporting means and a substantially horizontal top joining said sides, one of said sides having an aperture therein, a pencil type triode comprising a relatively elongated cathode member at one extremity thereof and a relatively elongated anode member at the other extremity thereof and a disc type flange member constituting a grid interposed between said cathode and said anode, said triode being positioned in said aperture in a manner whereby said anode is in electrical contact with the other of the sides of said tank inductance and said flange member is adjacent said one side of said tank inductance and substantially parallel thereto, a dielectric plate having an aperture therein, said dielectric plate being interposed between said one side of said tank inductance and said flange member in a manner whereby said first-mentioned and said last-mentioned apertures are substantially coaxial, means maintaining said dielectric plate interposed between said flange member and said one side of said tank inductance thereby to provide a grid capacitor, and a split stator type variable capacitor connected between the sides of said tank inductance.

3. An ultra high frequency oscillator arrangement, comprising supporting means, a tank inductance comprising a plate member having two substantially vertical sides supported by said supporting means and a substantially horizontal top joining said sides, one of said sides having an aperture therein, a pencil type triode comprising a relatively elongated cathode member at one extremity thereof and a relatively elongated anode member at the other extremity thereof and a disc type flange member constituting a grid interposed between said cathode and said anode, said triode being positioned in said aperture in a manner whereby said anode is in electrical contact with the other of the sides of said tank inductance and said flange member is adjacent said one side of said tank inductance and substantially parallel thereto, means connecting said cathode to a point at ground potential, a dielectric plate having an aperture therein, said dielectric plate being interposed between said one side of said tank inductance and said flange member in a manner whereby said first-mentioned and said last-mentioned apertures are substantially coaxial, electrically conductive clamping means maintaining said dielectric plate interposed between said flange member and said one side of said tank inductance thereby to provide a grid capacitor, a grid bias resistor, means connecting said grid bias resistor between said clamping means and a point at ground potential, and a split stator type variable capacitor connected between the sides of said tank inductance.

4. An ultra high frequency oscillator arrangement, comprising supporting means, a tank inductance comprising a plate member having two substantially vertical sides supported by said supporting means and a substantially horizontal top joining said sides, one of said sides having an aperture therein, a pencil type triode comprising a relatively elongated cathode member at one extremity thereof and a relatively elongated anode member at the other extremity thereof and a disc type flange member constituting a grid interposed between said cathode and said anode, said triode being positioned in said aperture in a manner whereby said anode is in electrical contact with the other of said sides of said tank inductance and said flange member is adjacent said one side of said tank inductance and substantially parallel thereto, means connecting said cathode to a point at ground potential, a dielectric plate having an aperture therein, said dielectric plate being interposed between said one side of said tank inductance and said flange member in a manner whereby said first-mentioned and last-mentioned apertures are substantially coaxial, means urging said flange member toward said one side of said tank inductance thereby maintaining said dielectric interposed between said flange member and the said one side thereby to provide a grid capacitor, a split stator type variable capacitor connected between the sides of said tank inductance, a grid bias resistor, means connecting said grid bias resistor between said grid and a point at ground potential, means for applying a bias voltage to said arrangement, a radio frequency choke coil connected between said bias voltage applying means and said top of said tank inductance at a point substantially midway between the sides thereof, and means for deriving an output oscillation from said tank inductance.

5. An ultra high frequency oscillator arrangement, comprising supporting means, a tank inductance comprising a plate member having two substantially vertical sides insulatedly supported by said supporting means and a substantially horizontal top joining said sides, one of said sides having an aperture therein, a pencil type triode comprising a relatively elongated cathode member at one extremity thereof and a relatively elongated anode member at the other extremity thereof and a disc type flange member constituting a grid interposed between said cathode and said anode, said triode being positioned in said aperture in a manner whereby said anode is in electrical contact with the other of said sides of said tank inductance and said flange member is adjacent said one side of said tank inductance and substantially parallel thereto, means connecting said cathode to a point at ground potential, a dielectric plate having an aperture therein, said dielectric plate being interposed between said one side of said tank inductance and said flange member in a manner whereby said first-mentioned and last-mentioned apertures are substantially coaxial, means urging said flange member toward said one side of said tank inductance thereby maintaining said dielectric interposed between said flange member and the said one side thereby to provide a grid capacitor, a split stator type variable capacitor connected between the sides of said tank inductance, a grid bias resistor, means connecting said grid bias resistor between said grid and a point at ground potential, means for applying a bias voltage to said arrangement, a radio frequency choke coil connected between said bias voltage applying means and said top of said tank inductance at a point substantially midway between the sides thereof, a bypass capacitor connected between said radio frequency choke coil at a point adjacent said bias voltage applying means and a point at ground potential, and means for deriving an output oscillation from said tank inductance.

References Cited in the file of this patent

UNITED STATES PATENTS

| | | |
|---|---|---|
| 2,487,619 | Usselman | Nov. 8, 1949 |
| 2,515,213 | Goddard et al. | July 18, 1950 |
| 2,520,148 | Johnson | Aug. 29, 1950 |